United States Patent
Duqi et al.

(10) Patent No.: US 10,961,117 B2
(45) Date of Patent: Mar. 30, 2021

(54) PROCESS FOR MANUFACTURING A MICROELECTROMECHANICAL DEVICE HAVING A SUSPENDED BURIED STRUCTURE AND CORRESPONDING MICROELECTROMECHANICAL DEVICE

(71) Applicant: STMICROELECTRONICS S.R.L., Agrate Brianza (IT)

(72) Inventors: Enri Duqi, Milan (IT); Lorenzo Baldo, Bareggio (IT); Flavio Francesco Villa, Milan (IT); Gabriele Barlocchi, Cornaredo (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 42 days.

(21) Appl. No.: 16/431,485

(22) Filed: Jun. 4, 2019

(65) Prior Publication Data
US 2019/0375629 A1    Dec. 12, 2019

(30) Foreign Application Priority Data
Jun. 8, 2018    (IT) .......................... 1020180006160

(51) Int. Cl.
*B81C 1/00*        (2006.01)
*B81B 7/02*        (2006.01)

(52) U.S. Cl.
CPC ............ *B81C 1/00047* (2013.01); *B81B 7/02* (2013.01); *B81C 1/00063* (2013.01); *B81C 1/00476* (2013.01); *B81C 1/00523* (2013.01); *B81B 2201/0235* (2013.01); *B81B 2201/0242* (2013.01); *B81B 2201/0271* (2013.01);
(Continued)

(58) Field of Classification Search
CPC ............ B81C 1/00047; B81C 1/00063; B81C 1/00476; B81C 1/00523; B81B 7/02
See application file for complete search history.

(56) References Cited

U.S. PATENT DOCUMENTS

| 6,936,902 B2 | 8/2005 | Reichenbach et al. |
| 8,766,380 B2 | 7/2014 | in 't Zandt et al. |
| 10,539,587 B2 * | 1/2020 | Kautzsch .............. G01P 15/125 |

(Continued)

FOREIGN PATENT DOCUMENTS

| DE | 102013222667 A1 | 5/2015 |
| EP | 1324382 B1 | 3/2007 |

(Continued)

*Primary Examiner* — Christine A Enad
(74) *Attorney, Agent, or Firm* — Seed Intellectual Property Law Group LLP (57) ABSTRACT

A process for manufacturing a microelectromechanical device envisages: providing a wafer of semiconductor material; forming a buried cavity, completely contained within the wafer, and a structural layer formed by a surface portion of the wafer and suspended over the buried cavity; forming first trenches through the structural layer as far as the buried cavity, which define the suspended structure in the structural layer; filling the first trenches and the buried cavity with sacrificial material; forming a closing structure above the structural layer; removing the sacrificial material from the first trenches and from the buried cavity to release the suspended structure, the suspended structure being isolated and buried within the wafer in a buried environment formed by the first trenches and by the buried cavity.

20 Claims, 6 Drawing Sheets

(52) U.S. Cl.
CPC ..... *B81B 2203/01* (2013.01); *B81B 2203/033* (2013.01); *B81B 2203/0315* (2013.01)

(56) References Cited

U.S. PATENT DOCUMENTS

| | | |
|---|---|---|
| 2018/0148325 A1 | 5/2018 | Duqi et al. |
| 2018/0217178 A1* | 8/2018 | Kautzsch ............... G01P 15/125 |
| 2019/0027399 A1* | 1/2019 | Uhlig ................. H01L 21/76205 |
| 2019/0162600 A1* | 5/2019 | Komenko ................. G01J 5/40 |

FOREIGN PATENT DOCUMENTS

| | | | | |
|---|---|---|---|---|
| EP | 2465817 A1 | | 6/2012 | |
| EP | 2599745 A1 | * | 6/2013 | ......... B81C 1/00603 |
| EP | 3326964 A1 | | 5/2018 | |
| WO | 01/46066 A2 | | 6/2001 | |

\* cited by examiner

PROCESS FOR MANUFACTURING A MICROELECTROMECHANICAL DEVICE HAVING A SUSPENDED BURIED STRUCTURE AND CORRESPONDING MICROELECTROMECHANICAL DEVICE

BACKGROUND

Technical Field

The present solution relates to a process for manufacturing a MEMS (Micro-Electro-Mechanical System) device having a suspended buried structure, and to a corresponding MEMS device.

Description of the Related Art

MEMS devices are known, amongst which, for example, accelerometers, gyroscopes, or resonators, that comprise suspended structures, anchored to a substrate by means of elastic suspension elements so as to be free to perform one or more movements indicative of one or more quantities to be detected.

These MEMS devices are typically obtained, using techniques for processing semiconductor materials, starting from one or more wafers of semiconductor material, which are subsequently housed in a package, i.e., a container that provides protection and defines the mechanical and electrical interface with respect to the external environment.

In particular, solutions are known in which the suspended structures (which comprise, for example, one or more suspended masses, electrodes, and elastic suspension elements) are arranged in a buried position within the wafer, enclosed in buried or hermetic cavities (in vacuum conditions or at a controlled pressure) so as to be intrinsically protected from contamination coming from the external environment. These solutions are advantageous, for example in terms of the packaging, which may in fact be made using traditional packaging techniques typical of semiconductors (with back-end processing steps).

A known process solution, such as the "MEMS First™ Process" developed and proposed by the company SiTime, envisages that the MEMS device is obtained starting from a composite SOI (Silicon-On-Insulator) wafer, constituted by an active layer, a distinct intermediate dielectric layer, and a distinct substrate. The corresponding suspended structure is defined in the active layer of the SOI wafer and subsequently released by means of selective removal of part of the underlying intermediate dielectric layer of the same SOI wafer so as to be suspended in a cavity. This cavity is subsequently hermetically closed, via formation of a capping surface layer.

The above solution has, however, certain limitations, due to the use of a composite SOI wafer, amongst which: high cost; difficulty of 3D integration, i.e., of vertical stacking of a number of MEMS devices; sensitivity to thermomechanical stresses, in particular coming from the package of the MEMS device; and consequent possibility of degradation of the performance over time.

BRIEF SUMMARY

One or more embodiments are directed to a process for manufacturing a microelectromechanical device, and a corresponding microelectromechanical device.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein.

DETAILED DESCRIPTION

Figure 1:
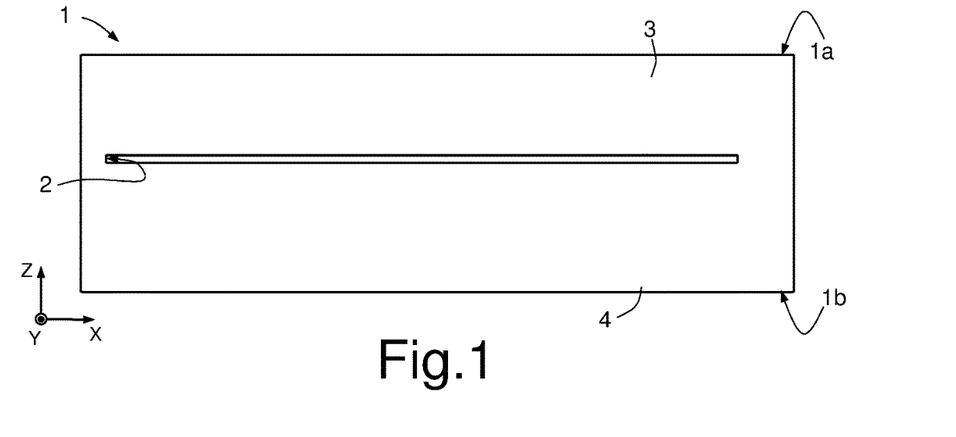
FIG. 1 is a schematic cross-sectional view of a wafer of semiconductor material, in an initial step of a process for manufacturing a microelectromechanical device.

With initial reference to FIG. 1, an aspect of the present solution envisages providing a microelectromechanical device starting from a wafer 1 of semiconductor material, in particular monocrystalline silicon, in which a buried cavity 2 is obtained.

The wafer 1 is constituted by a monolithic body, i.e., by a compact and uniform region of material, in particular monocrystalline silicon, having a top surface 1a and a rear surface 1b, both with planar extension in a horizontal plane xy defined by a first horizontal axis x and a second horizontal axis y, and separated by a thickness along a vertical axis z, which defines with the first and second horizontal axes x, y a set of three Cartesian axes.

The buried cavity 2 is completely contained within the wafer 1, and a structural layer 3 of semiconductor material, in particular monocrystalline silicon, is arranged at the top surface 1a, suspended over the buried cavity 2. The structural layer 3 has, for example, a thickness between 2 μm and 80 μm.

In particular, the buried cavity 2 is separated from the top surface 1a of the wafer 1 by the aforesaid structural layer 3, which is formed by a surface portion of the same wafer 1, and from the rear surface 1b of the wafer 1 by a substrate 4 of the same wafer 1, which is compact, homogeneous, and uniform.

The buried cavity 2 hence forms a buried environment, entirely contained and isolated within the wafer 1, not accessible from outside the same wafer 1.

The process for formation of the buried cavity 2 is carried out with techniques described in detail, for example, in EP 1 324 382 B1, filed in the name of the present Applicant.

Figure 2A:
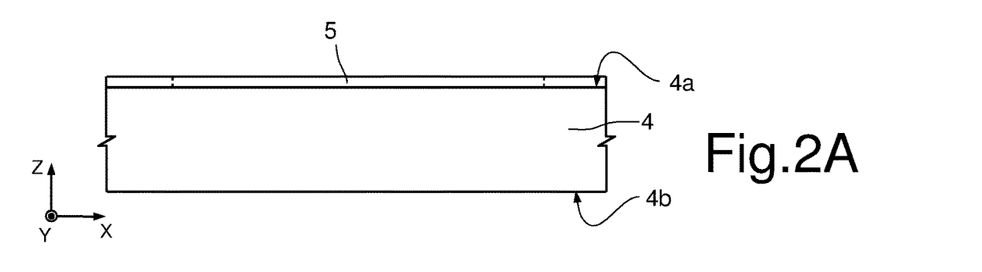
FIGS. 2A-2E are schematic cross-sectional views of the wafer in successive steps of formation of a buried cavity within the wafer.

In an initial step of the manufacturing process, as illustrated schematically in FIG. 2A, the wafer 1 of semiconductor material, for example monocrystalline silicon, is provided, comprising the substrate 4, having a front surface 4a and a rear surface 4b (coinciding with the rear surface 1b of the wafer 1).

Figure 2B:
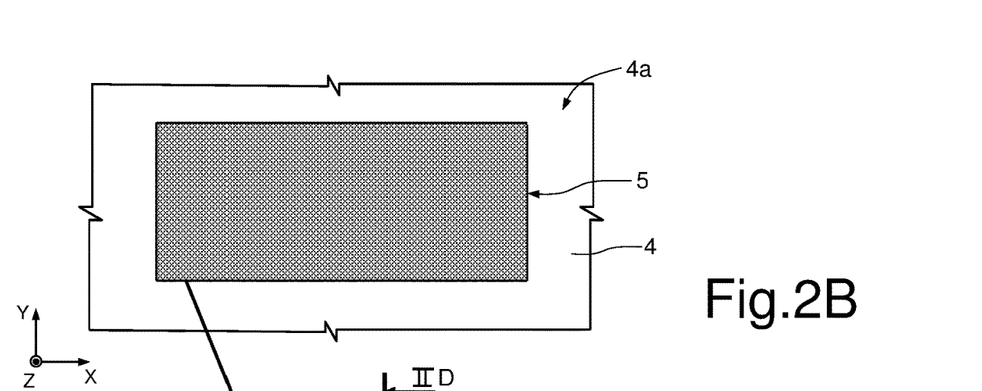

As illustrated also in FIG. 2B (not in scale), an etching mask 5 is provided on the front surface 4a of the substrate 4, made of a photosensitive material, also referred to as "photoresist".

The etching mask 5 defines an etching area, which corresponds to the area that will be occupied by the buried cavity 2, and has an extension corresponding to the extension of the structural layer 3 that will be formed on the same buried cavity 2.

Figure 2C:
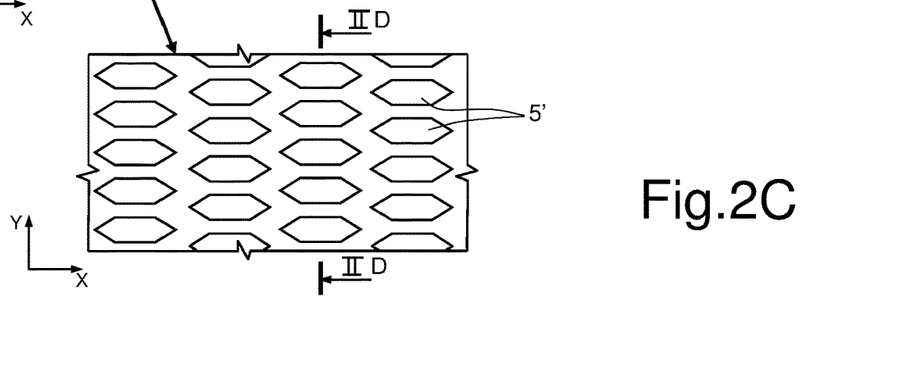

As illustrated in the enlarged detail of FIG. 2C, the etching mask 5 comprises a plurality of mask portions 5', that are, for example, hexagonal, and define a lattice, for example a honeycomb lattice.

Then (see FIG. 2D, which, like FIG. 2C, represents only an enlarged portion of the wafer 1, for reasons of clarity of illustration), anisotropic chemical etching of the substrate 4 is carried out using the etching mask 5, following upon which trenches 6 are formed, which communicate with one another and delimit a plurality of columns 7.

Figure 2D:
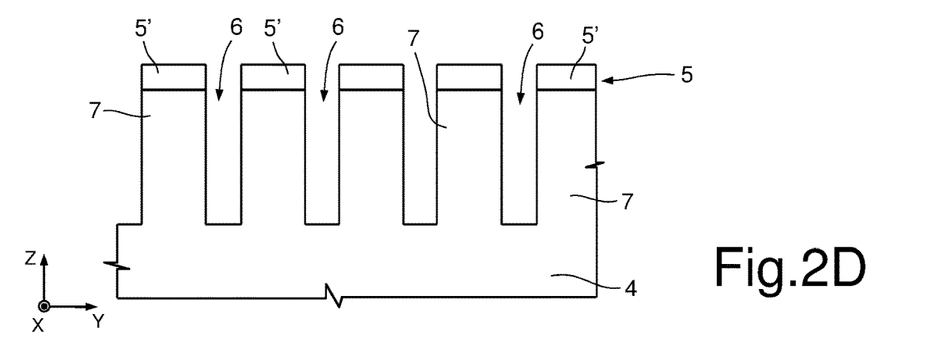

In practice, the trenches 6 form an open region of a complex shape (corresponding to the lattice of the etching mask 4), extending in which are the columns 7 (of a shape corresponding to the mask portions 5').

Next, the etching mask 4 is removed, and an epitaxial growth is carried out in a deoxidizing environment (typically, in an atmosphere with a high concentration of hydrogen, preferably with trichlorosilane—$SiHC_{13}$). Consequently, an epitaxial layer grows on the front surface 4a and in particular on the columns 7 and closes the aforesaid open region formed by the trenches 6 at the top.

Figure 2E:
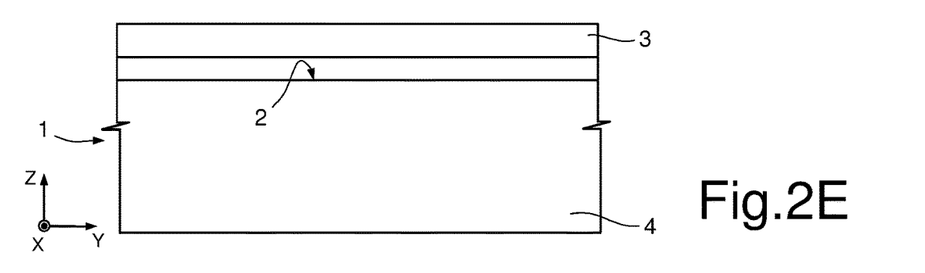

A step of thermal annealing is then carried out, for example for 30 minutes at 1190° C., preferably in a reducing atmosphere, typically a hydrogen atmosphere. The annealing step causes migration of the silicon atoms, which tend to move into a position of lower energy. Consequently, and also due to the short distance between the columns 7, the silicon atoms migrate completely from the portions of the columns 7 present within the aforesaid open region formed by the trenches 6, and, starting from the same region, a buried region is formed, as illustrated in FIG. 2E (which shows a portion of the wafer 1 corresponding to what is illustrated in FIG. 2D).

In particular, the aforesaid buried region defines the buried cavity 2 inside which is created, as a result of the process steps described, an environment with controlled atmosphere, containing residual gas (in the example, hydrogen and silane) at a desired pressure.

Above the buried region a layer of monocrystalline silicon remains, constituted in part by epitaxially grown silicon atoms and in part by migrated silicon atoms, which forms the aforesaid structural layer 3 and defines the surface portion of the monolithic body of the wafer 1.

Figure 3:
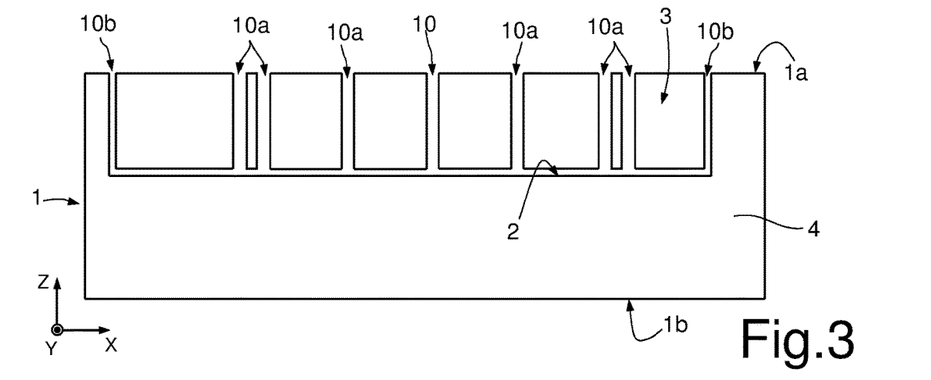
FIGS. 3-10 are schematic cross-sectional views of the wafer in successive steps of formation of a suspended structure of the microelectromechanical device, according to an embodiment of the present solution.

As illustrated in FIG. 3, after formation of the buried cavity 2 by means of the steps described previously, the process for manufacturing the MEMS device proceeds with etching of a plurality of trenches 10, which extend vertically throughout the thickness of the structural layer 3, starting from the top surface 1a of the wafer 1 until the buried cavity 2 is reached (these trenches 10 are hence in fluidic communication with the buried cavity 2).

In particular, the trenches 10 comprise definition trenches 10a, arranged internally to the structural layer 3, so as to define, as will be evident to a person skilled in the field, elements of what will be the suspended structure of the MEMS device, for example, one or more suspended masses, driving and/or sensing electrodes, and elastic suspension elements; and moreover isolation trenches 10b, arranged externally with respect to the structural layer 3, along the perimeter of the same structural layer 3.

Figure 4:
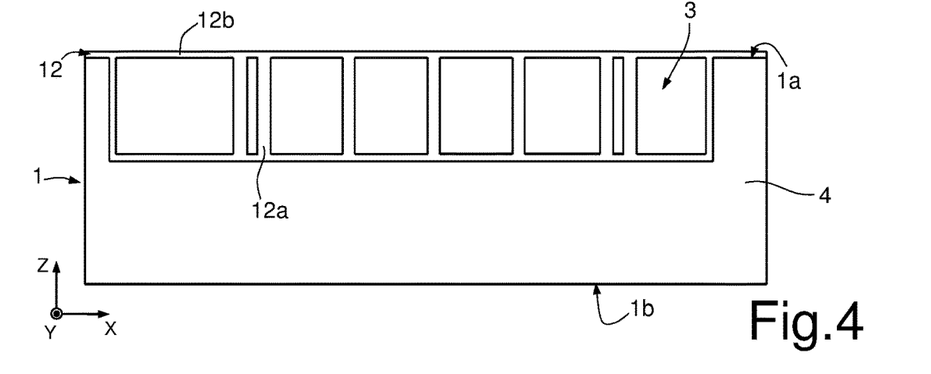

As illustrated in FIG. 4, a step of thermal oxidation of the wafer 1 is carried out, which leads to formation of an oxide layer 12, comprising a buried region 12a that entirely fills the buried cavity 2 and the trenches 10 and moreover a surface region 12b that coats the wafer 1 at the top, on its top surface 1a.

Figure 5:
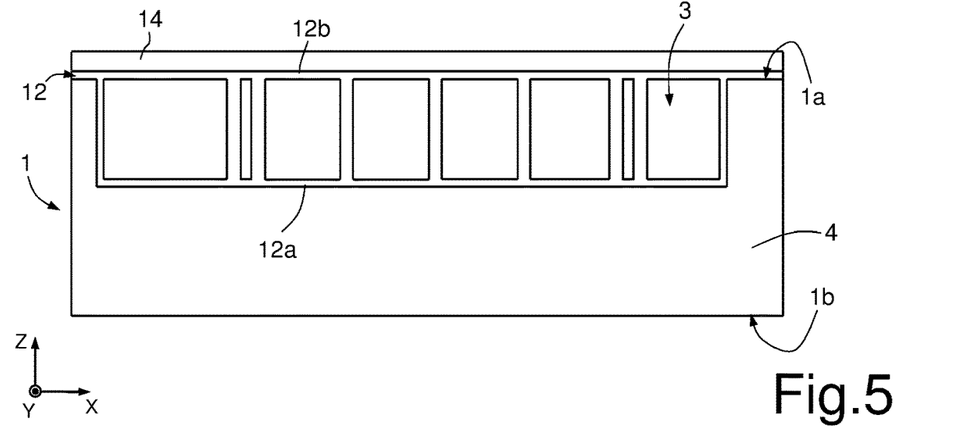

As illustrated in FIG. 5, a polysilicon layer 14 is grown and planarized, coating the surface region 12b of the oxide layer 12 entirely.

Figure 6:
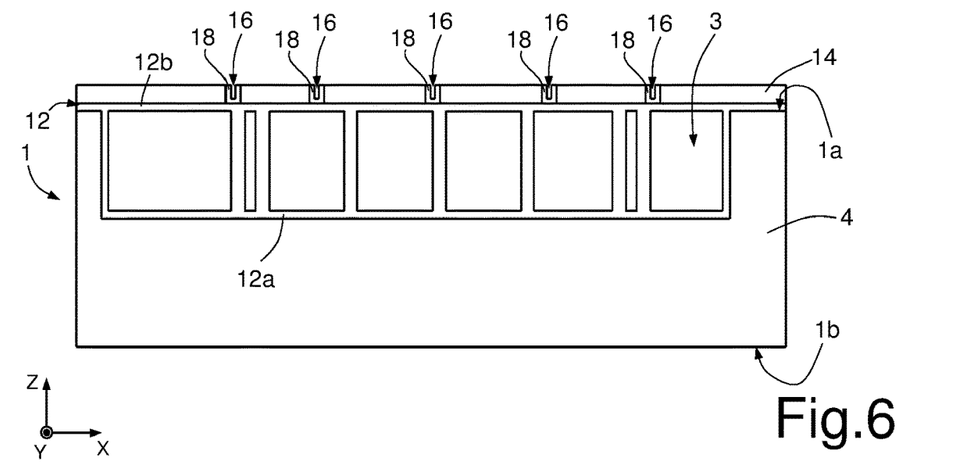

With reference to FIG. 6, the polysilicon layer 14 is subjected to etching, for formation, throughout its thickness up to the surface region 12b of the oxide layer 12, of a plurality of openings 16, appropriately arranged and spaced apart from one another, for example uniformly to form a lattice, above the structural layer 3. These openings 16, for example of a square shape in plan view, may, for instance, have a side comprised between 1 μm and 5 μm.

Next, for example using the same mask used previously for etching, a deposition of porous polysilicon is carried out to form, in a conformable manner within the aforesaid openings 16, coating regions 18, in contact with the side and bottom walls of the openings 16 (it should be noted that these coating regions 18 do not fill the openings 16 completely).

Figure 7:
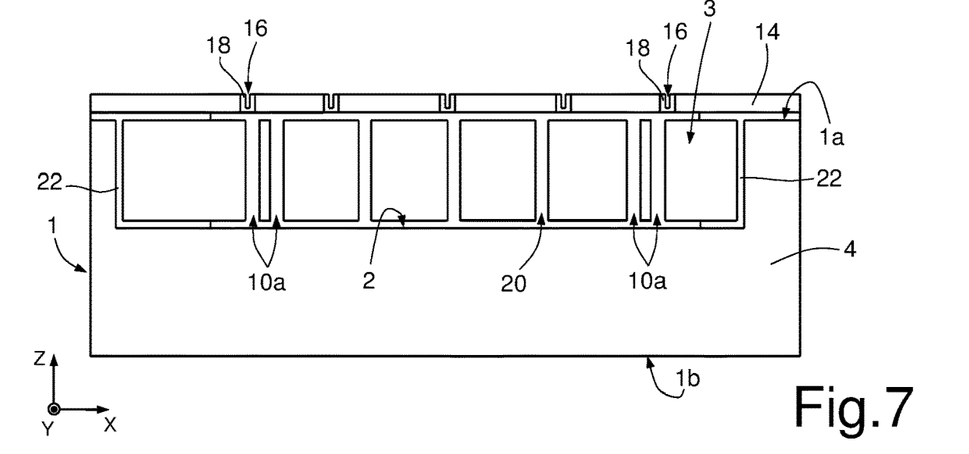

With reference to FIG. 7, a step of removal of the oxide layer 12 is carried out, in particular by means of chemical etching, for example using hydrofluoric acid (HF), which passes through the coating regions 18. These coating regions 18 are, in fact, permeable to the etching gas, enabling introduction thereof within the wafer 1.

Removal of the oxide layer 12, and in particular of at least part of the buried region 12a and of the surface region 12b, leads to release of the suspended structure of the MEMS device, which had previously been defined in the structural layer 3, which is thus suspended within a buried environment 20, formed by the buried cavity 2 and by the definition trenches 10a (which are now open for removal of the buried region 12a of the oxide layer 12) and by an empty space defined on the top surface 1a in a region corresponding to the structural layer 3 (which is now empty following removal of the surface region 12b of the oxide layer 12).

It is to be noted that etching of the oxide layer 12 leaves intact insulation regions 22 belonging to the same oxide layer 12 (comprising a remaining peripheral part of the buried region 12a and of the surface region 12b), that remain within the isolation trenches 10b and at peripheral regions of the buried cavity 2, externally with respect to the structural layer 3.

Figure 8:
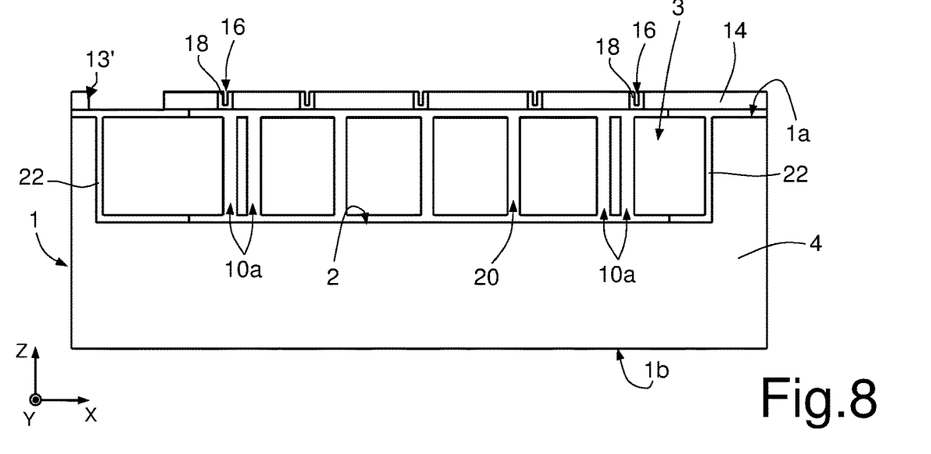

With reference to FIG. 8, the polysilicon layer 14 undergoes a new etching step, to form, throughout its thickness, as far as the remaining surface region 12b of the oxide layer 12 at one or more of the aforesaid insulation regions 22, respective insulation openings 13'.

Figure 9:
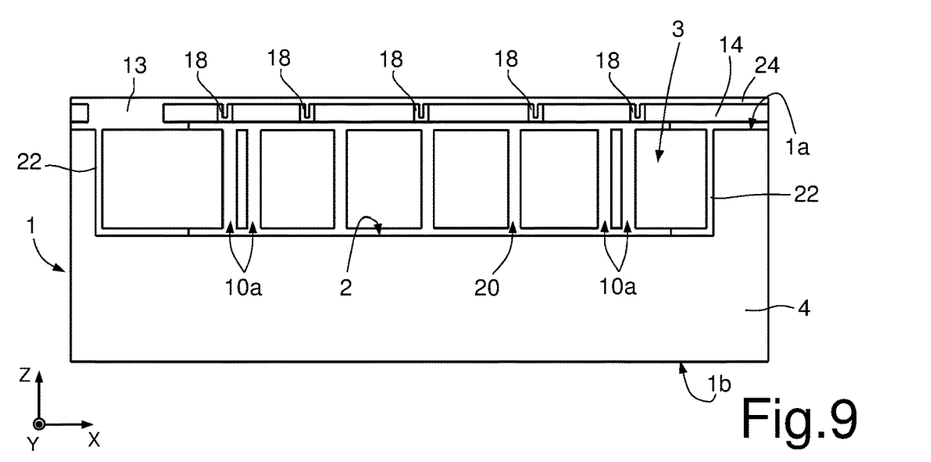

With reference to FIG. 9, a step of oxide deposition is carried out, to obtain a covering oxide layer 24, which is formed uniformly over the wafer 1 to coat the polysilicon layer 14 and in particular fill completely the openings 16, coming into contact with the coating regions 18, and the insulation openings 13', to form, at the peripheral portions of the structural layer 3, insulation regions 13, constituted by thick oxide regions.

The buried environment 20 is at this point completely isolated within the wafer 1, in a hermetic manner, being in vacuum conditions or set at a pressure of a controlled value.

The polysilicon layer 14 is moreover electrically insulated with respect to the underlying wafer 1, and in particular with respect to the structural layer 3 and to the substrate 4.

The process proceeds (FIG. 10) with definition via etching of contact openings 26 in order to enable electrical contact with the suspended structure of the MEMS device and/or with the polysilicon layer 14.

Figure 10:
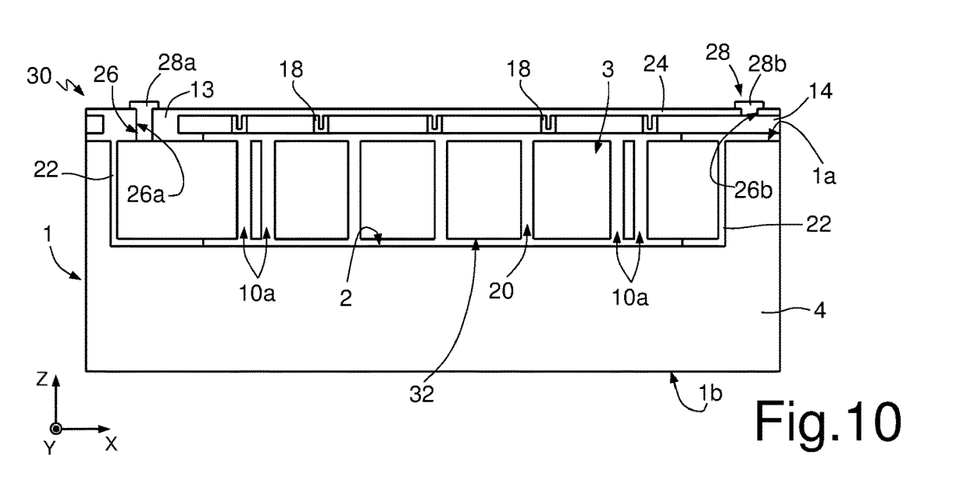

In the example, there are defined: at least one first contact opening 26a, through the covering oxide layer 24 and a respective insulation region 13, until the top surface 1a of the wafer 1 is reached, internally (in the horizontal plane xy) with respect to the insulation regions 22; and at least one second contact opening 26b through the covering oxide layer 24, until the underlying polysilicon layer 14 is reached, externally (in the horizontal plane xy) with respect to the lateral insulation regions 22.

A conductive layer is deposited and is appropriately patterned, for example by photolithographic etching, to form electrical contacts 28 within the contact openings 26 formed previously. In the example, there are hence formed: at least one first electrical contact 28a, within the first contact opening 26a, for electrical contact of the suspended structure of the MEMS device (for example, of a corresponding electrode or a corresponding suspended inertial mass); and a second electrical contact 28b within the second opening 26b, for electrical contact of the polysilicon layer 14 (for example, of a corresponding conductive pad or path that may be formed in the same polysilicon layer 14).

A MEMS device is thus defined, designated by 30 in the aforesaid FIG. 10, where a suspended structure, designated by 32, is buried and hermetically isolated within the wafer 1. The electrical contacts 28 enable electrical connection with the suspended structure 32, for example for acquisition of an electrical signal of capacitive variation, which may be indicative of the movement of a suspended mass, for example an inertial mass, of the suspended structure 32.

As mentioned previously, the MEMS device 30 may be a sensor device, for example an accelerometer, a gyroscope, or a resonator designed for RTC (Real-Time Clock) applications.

Figure 11A:
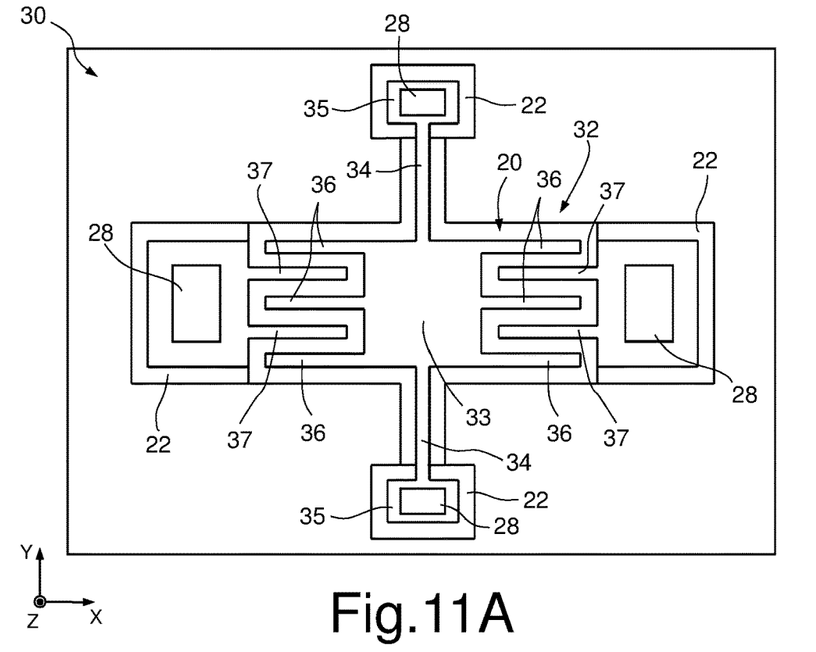
FIGS. 11A-11B are schematic top plan views of two possible different suspended structures of the microelectromechanical device.

FIG. 11A shows a schematic top plan view of a possible embodiment of the suspended structure 32 of the MEMS device 30, which in this case defines a uniaxial accelerometer.

The suspended structure 32 in this case comprises an inertial mass 33, elastically suspended within the buried environment 20, by means of elastic suspension elements 34, which connect the inertial mass 33 to anchorages 35 constituted by surface regions of the wafer 1 surrounded by insulation regions 22.

The suspended structure 32 further comprises mobile electrodes 36, fixedly carried by the inertial mass 33, and fixed electrodes 37, capacitively coupled (in the horizontal plane xy) and comb-fingered with the mobile electrodes 36; the fixed electrodes 37 are fixedly coupled to respective regions of the surface portion of the wafer 1 that are surrounded by respective insulation regions 22.

As illustrated once again in FIG. 11A, the MEMS device 30 in this case comprises electrical contacts 28, obtained through respective contact openings 26, for electrical contact of the fixed electrodes 37 and of the inertial mass 33 (and, consequently, of the mobile electrodes 36) so as to enable detection of the capacitive variation signal of the sensing capacitor formed between the mobile and fixed electrodes 36, 37, indicative of the movement of the inertial mass 33 in the horizontal plane xy (in the example, along the first horizontal axis x).

Figure 11B:
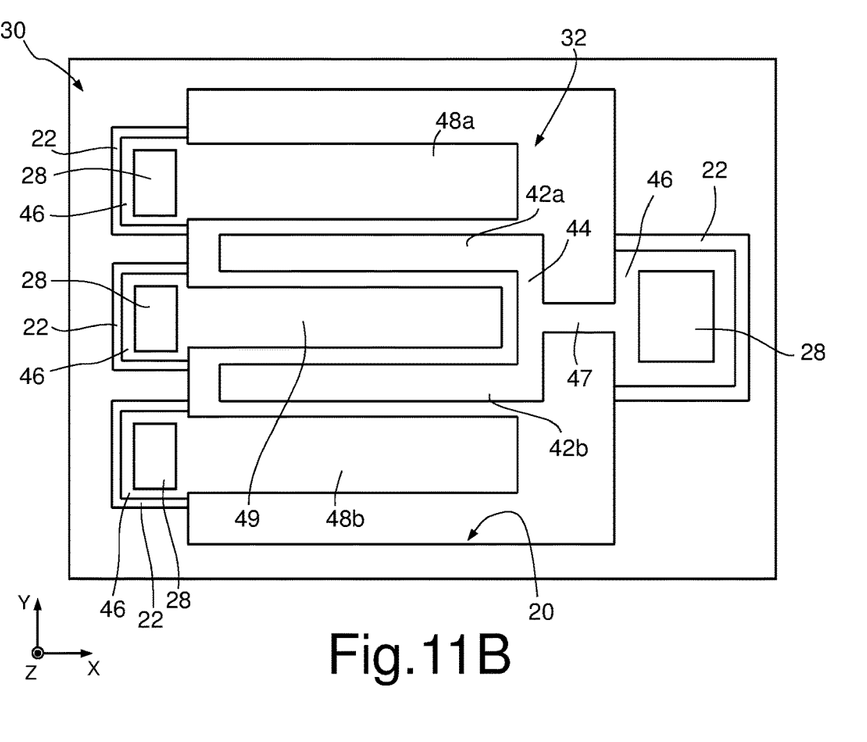

FIG. 11B is a schematic top plan view of a further possible embodiment of the suspended structure 32 of the MEMS device 30, which in this case defines a resonator of a tuning-fork type.

The suspended structure 32 in this case comprises a first arm (or beam) 42a and a second arm (or beam) 42b, parallel to one another, with main extension in the longitudinal direction, in the example along the first horizontal axis x of the horizontal plane xy. The first and second arms 42a, 42b each have a first free end and are connected at a second end thereof by a transverse connecting element 44, having an extension along the second horizontal axis y; this transverse connecting element 44 is anchored to the substrate 4 by means of an anchorage 46, to which it is coupled by means of a connection element 47. The anchorage 46 is constituted by a surface region of the wafer 1 surrounded by an insulation region 22.

The suspended structure 32 further comprises: a first driving electrode 48a and a second driving electrode 48b, which are arranged facing, and are parallel to, the first arm 42a and the second arm 42b, respectively, externally with respect to the same first and second arms 42a, 42b; and a sensing electrode 49, which in turn faces, and is parallel to the first and second arms 42a, 42b, internally with respect to the same first and second arms 42a, 42b (it is to be noted that the driving electrodes 48a, 48b, the sensing electrode 49, and the arms 42a, 42b are all formed starting from one and the same structural layer 3).

The first and second driving electrodes 48a, 48b and the sensing electrode 49 are anchored to the substrate 4 of the MEMS device 30 by means of respective anchorages 46, which are also constituted by surface regions of the wafer 1 surrounded by insulation regions 22.

During operation, application of an appropriate biasing voltage between the driving electrodes 48a, 48b and the first and second arms 42a, 42b of the suspended structure 32 causes a movement of deformation by bending of the corresponding first and second arms 42a, 42b, at the resonance frequency (driving excites the anti-phase vibrational mode of the arms 42a, 42b).

The consequent approach to, or movement away from, the sensing electrode 49 causes a variation of the capacitive coupling and generation of an associated electrical signal, which is also at the resonance frequency, that can then be detected and appropriately processed by an electronic circuit associated to the MEMS device 30.

For this purpose, as illustrated once again in FIG. 11B, the MEMS device 30 also comprises in this case electrical contacts 28, obtained through respective contact openings 26, for electrical contact of the driving electrodes 48a, 48b, of the sensing electrode 49, and of the first and second arms 42a, 42b, so as to enable detection of the capacitive-variation signal.

Figure 12:
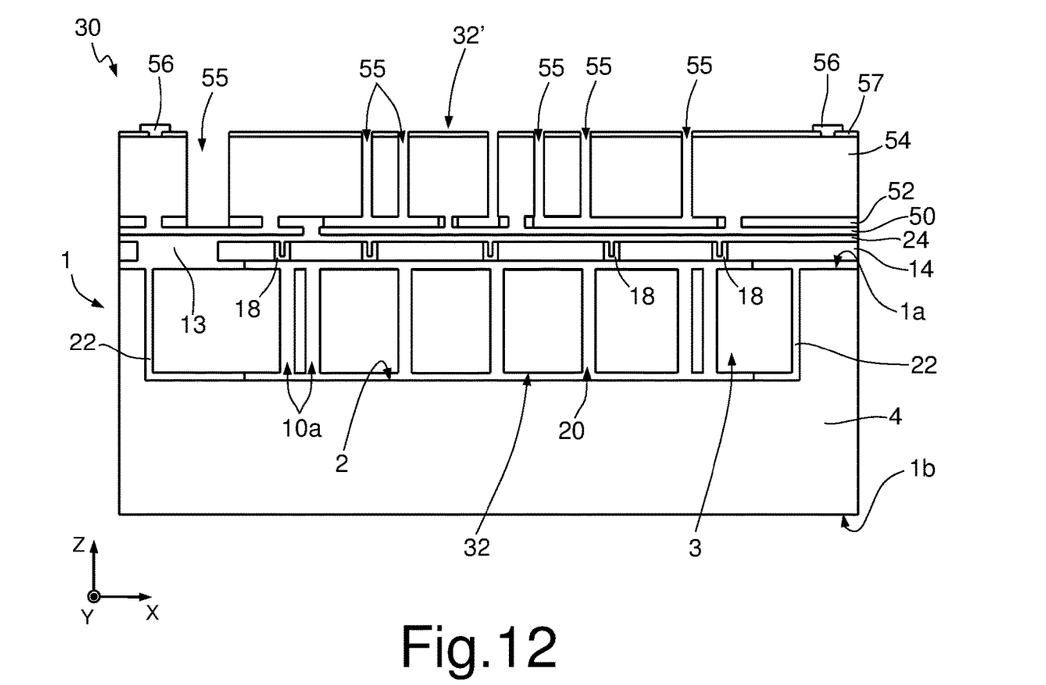
FIGS. 12 and 13 are schematic cross-sectional views of further embodiments of the microelectromechanical device according to the present solution.

With reference to FIG. 12, a further aspect of the present solution is now described, which envisages the possibility of forming in a stacked way a further suspended structure 32' of the MEMS device 30 on the suspended structure 32 buried and isolated within the wafer 1, using 3D-stacking techniques.

The further suspended structure 32' may be obtained with processes of surface micromachining, for example using ThELMA (Thick Epipoly Layer for Microactuators and Accelerometers) process.

In particular, the manufacturing process envisages, in this case, at the end of the process steps described previously for formation of the suspended structure 32 buried and isolated within the wafer 1, deposition of a further polysilicon layer 50 on the covering oxide layer 24. This polysilicon layer 50 is then patterned, by means of a photolithographic process, for definition of horizontal electrical interconnections (designed, for example, for providing contact pads and associated electrical paths).

A further sacrificial layer 52, made of silicon oxide, is then deposited and patterned on the aforesaid polysilicon layer 50. Next, epitaxial growth is carried out of a further structural layer 54, for example made of polysilicon, designed for formation of the further suspended structure 32' and of corresponding anchorage elements (which extend through openings previously defined in the sacrificial layer 52 until the polysilicon layer 50 is contacted).

Appropriate contact metallizations 56 are formed through a further covering oxide layer 57, which coats the structural layer 54.

The structural layer 54 is then defined by means of trench etching, for formation of appropriate trenches 55, which define what will be the suspended elements of the aforesaid suspended structure (for example, one or more suspended masses, capacitively coupled sensing electrodes, and elastic suspension elements).

Removal of the oxide of the sacrificial layer 52 is carried out by means of chemical etching through the trenches 55, for release of the suspended elements.

Through the aforesaid contact metallizations 56 a further capacitive-variation signal can thus be detected, indicative of the movement of the suspended mass of the further suspended structure 32'.

For instance, the aforesaid further suspended structure 32' may define an accelerometer, in particular of a biaxial type, which is to form, with the suspended structure 32, in this case defining a uniaxial accelerometer, a triaxial acceleration-detection system, which is extremely compact in the vertical direction.

According to yet a further aspect of the present solution (illustrated with reference to FIG. 13), the manufacturing process may envisage providing the suspended structure 32 of the MEMS device 30 in a portion of the wafer 1, which is elastically isolated with respect to the substrate 4, so as to isolate the same suspended structure 32 from thermomechanical stresses coming from the substrate 4 (for example, coming from a corresponding package, here not illustrated).

Figure 13:
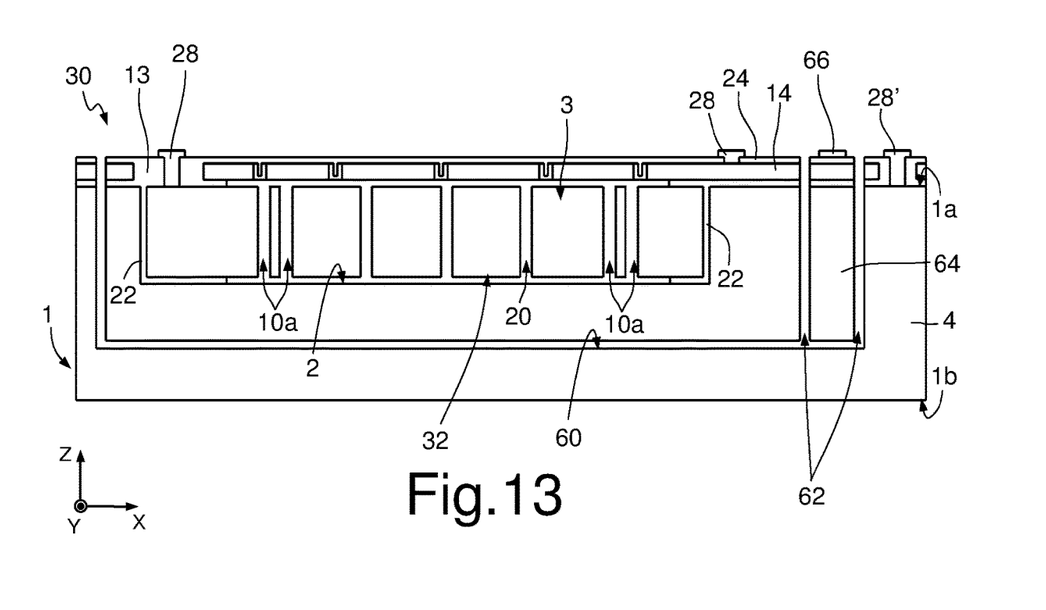

In this embodiment, the manufacturing process envisages, in the first place, formation of a deep buried cavity 60, at a depth from the top surface 1a of the wafer 1 greater than the depth of the buried cavity 2. This deep buried cavity 60 moreover has an extension in the horizontal plane xy greater than the corresponding extension of the buried cavity 2.

The deep buried cavity 60 may be obtained with initial process steps that are altogether similar to what has been described previously for formation of the buried cavity 2. The buried cavity 2 may then be formed, using the steps described previously, in the epitaxial layer grown to close the deep buried cavity 60.

The process for manufacturing the MEMS device 30 then proceeds in a way altogether similar to what has been illustrated previously, in particular for formation of the suspended structure 32, buried in the wafer 1 within the buried environment 20.

At the end of the process steps described, in this case deep-isolation trenches 62 are opened, externally with respect to the structural layer 3 of the suspended structure 32 and of the insulation regions 22 of the oxide layer 12 so as to reach in depth the deep buried cavity 60. These deep-isolation trenches 62 define, between them, elastic-isolation elements 64, which have a high stiffness (given that they have a main dimension comprised between 5 μm and 80 μm), which elastically connect the portion of the wafer 1 in which the MEMS device 30 is provided to the substrate 4, thus guaranteeing elastic isolation thereof.

As illustrated once again in FIG. 13, in this case further electrical contacts 28' may be formed externally with respect to the elastically isolated portion of the wafer 1, and appropriate conductive paths 66 may be formed on the elastic-isolation elements 64 (in particular, on the covering oxide layer 24), for example for electrical connection of the electrical contacts 28 of the MEMS device 30 to the aforesaid further electrical contacts 28'. Advantageously, these further electrical contacts 28' may be used for operations of electrical bonding, which may be obtained on the outside of the portion of wafer 1 in which the suspended structure 32 is formed, hence not affecting operativeness thereof.

The advantages of the present solution emerge clearly from the foregoing description.

In any case, it is again highlighted that this solution allows to manufacture, starting from a wafer 1 of semiconductor material, a MEMS device 30 provided with a suspended structure 32 completely buried within the wafer 1, by means of a process that has lower costs and a lower complexity than known solutions.

Moreover, the solution described enables vertical stacking, on the suspended structure 32 of the MEMS device 30, of one or more further suspended structures 32', arranged on the same suspended structure 32 and formed with surface processing steps, for example using the ThELMA technique. The aforesaid processing steps are advantageously carried out on a covering oxide layer 24 that coats and protects the underlying suspended structure 32 of the MEMS device 30, which is hence not adversely affected by the same processing steps.

The solution described moreover enables a mechanical decoupling of the MEMS device 30 and of the corresponding suspended structure 32, via formation of a deep buried cavity 60, at a greater depth than the buried cavity 2 of the suspended structure 32, and of corresponding mechanical-decoupling elements 64 that elastically decouple the suspended structure 32 from the substrate 4 of the wafer 1.

Finally, it is clear that modifications and variations may be made to what has been described and illustrated herein, without thereby departing from the scope of the present disclosure.

In particular, it is evident that the suspended structure 32 of the MEMS device 30 may differ from what has been described by way of example; it may comprise, for instance, further or different suspended elements, inertial masses, electrodes or elastic elements, arranged appropriately according to the particular application, it being possible for the MEMS device 30 to define a different inertial sensor, for example a uniaxial, biaxial, or triaxial gyroscope or accelerometer in a way that will on the other hand be evident to a person skilled in the field.

Likewise, stacking of further suspended structures 32, 32', even different from the ones illustrated previously by way of example, may be carried out.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a microelectromechanical (MEMS) device, comprising:
    forming a buried cavity completely contained within a wafer of semiconductor material, a surface portion of the wafer defining a structural layer suspended over the buried cavity, wherein forming the buried cavity comprises:
        etching a plurality of second trenches that are delimited by columns of semiconductor material;
        epitaxially growing, starting from the columns, an epitaxial layer of semiconductor material, the layer closing top portions of the plurality of second trenches; and
        carrying out a thermal treatment and causing migration of the semiconductor material of the columns towards the epitaxial layer to form the buried cavity, wherein the structural layer is suspended over the buried cavity;
    forming a plurality of first trenches in the structural layer, the plurality of first trenches extending from the surface portion to the buried cavity;
    filling the plurality of first trenches and the buried cavity with sacrificial material;
    forming a closing structure above the structural layer; and
    removing the sacrificial material from the buried cavity and from the plurality of first trenches to release a suspended structure, the suspended structure being buried within the wafer.

2. The process according to claim 1, further comprising forming the buried cavity and the structural layer in a portion of the wafer elastically isolated from a substrate of the wafer.

3. The process according to claim 2, wherein the buried cavity is a first buried cavity, the process further comprising:
    prior to forming the buried cavity and the structural layer, forming a second buried cavity at a depth in the wafer greater than a depth of the buried cavity, the second buried cavity having an extension in a horizontal plane that is transverse with respect to a direction of the depth, wherein the extension is greater than a corresponding extension of the first buried cavity; and
    after releasing the suspended structure, forming isolation trenches externally with respect to the structural layer such as to reach in depth the second buried cavity and define, between the isolation trenches, elastic-isolation elements configured to elastically couple the portion to the substrate of the wafer and thereby provide elastic isolation of the portion.

4. The process according to claim 1, wherein the MEMS device includes at least one sensor chosen among: an accelerometer; a gyroscope; and a resonator.

5. A process for manufacturing a microelectromechanical (MEMS) device, comprising:
    forming a buried cavity completely contained within a wafer of semiconductor material, a surface portion of the wafer defining a structural layer suspended over the buried cavity;
    forming a plurality of first trenches in the structural layer, the plurality of first trenches extending from the surface portion to the buried cavity;
    filling the plurality of first trenches and the buried cavity with sacrificial material;
    forming a closing structure above the structural layer; and
    removing the sacrificial material from the buried cavity and from the plurality of first trenches to release a suspended structure, the suspended structure being buried within the wafer,
    wherein forming the closing structure comprises forming a closing layer on the structural layer,
    wherein after filling the plurality of first trenches, the process comprises forming a plurality of through openings in the closing layer and coating the plurality of through openings with porous material regions, and
    wherein removing the sacrificial material comprises carrying out a chemical etching of the sacrificial material through the porous material regions.

6. The process according to claim 5, wherein forming the buried cavity comprises:
    etching a plurality of second trenches that are delimited by columns of semiconductor material;
    epitaxially growing, starting from the columns, an epitaxial layer of semiconductor material, the layer closing top portions of the plurality of second trenches; and
    carrying out a thermal treatment and causing migration of the semiconductor material of the columns towards the epitaxial layer to form the buried cavity, wherein the structural layer is suspended over the buried cavity.

7. The process according to claim 5, wherein the closing layer is made of polysilicon, and the porous material regions are made of porous polysilicon.

8. The process according to claim 5, wherein forming the closing structure further comprises, after removing the sacrificial material, forming a covering layer of insulating material on the closing layer, wherein the covering layer completely covers the plurality of through openings.

9. The process according to claim 8, further comprising forming, together with the plurality of first trenches, a plurality of third trenches through the structural layer, the plurality of third trenches extending from the surface portion to the buried cavity,
    wherein filling comprises filling the plurality of third trenches with the sacrificial material, and
    wherein, after removing the sacrificial material, insulation regions remain within the plurality of third trenches and at peripheral regions of the buried cavity and external with respect to the structural layer.

10. The process according to claim 9, further comprising forming a plurality of contacts through the covering structure, the plurality of contacts being configured to contact electrically the suspended structure internally with respect to the insulation regions.

11. The process according to claim 8, wherein the suspended structure is a first suspended structure, the process further comprising forming in a second suspended structure stacked above the first suspended structure.

12. The process according to claim 11, wherein the structural layer is a first structural layer, wherein forming the second suspended structure comprises:
    depositing and defining a conductive layer above the covering structure;
    depositing and defining a sacrificial layer above the conductive layer;
    epitaxially growing a second structural layer above the sacrificial layer;
    etching the second structural layer to form a plurality of fourth trenches and define the second suspended structure; and
    removing the sacrificial layer through the plurality of fourth trenches to release the second suspended structure.

13. A microelectromechanical device, comprising:
    a monolithic body of semiconductor material;
    a buried cavity completely contained within the monolithic body, and a structural layer formed by a surface portion of the monolithic body, wherein the structural layer is suspended over the buried cavity;

a plurality of first trenches extending from the structural layer to the buried cavity and defining a suspended structure in the structural layer; and a closing structure spaced apart from the suspended structure and forming a cavity between a surface of the closing structure and a surface the suspended structure, the suspended structure being a single layer formed by the monolithic body, the surface of the suspended structure remaining exposed in the cavity.

14. The device according to claim 13, wherein the buried cavity is separated from the surface of the monolithic body by the structural layer and from a rear surface of the monolithic body by a compact, homogeneous, and uniform substrate, thus forming, together with the plurality of first trenches, the buried environment entirely contained and isolated within the monolithic body.

15. The device according to claim 13, further comprising insulation regions arranged within isolation trenches and in peripheral regions of the buried cavity, the isolation trenches being arranged externally with respect to the structural layer extending from the surface of the monolithic body to the buried cavity.

16. The device according to claim 13, further comprising a plurality of contacts traversing the covering structure, wherein the plurality of contacts are configured to electrically couple with the suspended structure and are arranged internally with respect to the insulation regions.

17. The process according to claim 13, wherein the buried cavity and the structural layer are arranged in a portion of the monolithic body that is elastically isolated from a corresponding substrate.

18. The device according to claim 17, wherein the buried cavity is a first buried cavity, the device further comprising:

a second buried cavity arranged at a depth measured from a top surface of the monolithic body that is greater than a depth of the first buried cavity, the second buried cavity having an extension in a horizontal plane that is transverse to a direction of the depth and greater than a corresponding extension of the first buried cavity; and isolation trenches arranged externally with respect to the structural layer, wherein the isolation trenches extend to the second buried cavity and delimit elastic-isolation elements that are configured to elastically couple the portion of the monolithic body and thereby provide elastic isolation of the portion.

19. A microelectromechanical device, comprising:

a monolithic body of semiconductor material;

a buried cavity completely contained within the monolithic body, and a structural layer formed by a surface portion of the monolithic body, wherein the structural layer is suspended over the buried cavity;

a plurality of first trenches extending from the structural layer to the buried cavity and defining a first suspended structure in the structural layer;

a closing structure arranged above the structural layer that buries the first suspended structure in the monolithic body; and a second suspended structure arranged in a stacked manner above the first suspended structure.

20. The device according to claim 19, wherein the structural layer is a first structural layer, wherein the second suspended structure comprises:

a conductive layer above the covering structure;

a sacrificial layer above the conductive layer; and a second structural layer above the sacrificial layer, wherein a plurality of trenches extend through the second structural layer.

* * * * *

UNITED STATES PATENT AND TRADEMARK OFFICE
CERTIFICATE OF CORRECTION

PATENT NO. : 10,961,117 B2
APPLICATION NO. : 16/431485
DATED : March 30, 2021
INVENTOR(S) : Duqi et al.

Page 1 of 1

It is certified that error appears in the above-identified patent and that said Letters Patent is hereby corrected as shown below:

In the Claims

Column 11, Line 8, Claim 13:
"surface the" should read, --surface of the--.

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*